(12) United States Patent
Hosseini et al.

(10) Patent No.: US 7,368,824 B2
(45) Date of Patent: May 6, 2008

(54) DIFFUSION SOLDER POSITION, AND PROCESS FOR PRODUCING IT

(75) Inventors: Khalil Hosseini, Weihmichl (DE); Edmund Riedl, Obertraubling (DE)

(73) Assignee: Infineon Technologies AG, Neubiberg (DE)

( * ) Notice: Subject to any disclaimer, the term of this patent is extended or adjusted under 35 U.S.C. 154(b) by 253 days.

(21) Appl. No.: 10/927,621

(22) Filed: Aug. 27, 2004

(65) Prior Publication Data

US 2005/0048758 A1 Mar. 3, 2005

Related U.S. Application Data

(63) Continuation of application No. PCT/DE03/00603, filed on Feb. 26, 2003.

(30) Foreign Application Priority Data

Feb. 28, 2002 (DE) .................... 102 08 635

(51) Int. Cl.
*H01L 21/31* (2006.01)
(52) U.S. Cl. .................. 257/779; 257/E21.509; 438/614
(58) Field of Classification Search ............. 438/123, 438/612, 614; 257/779
See application file for complete search history.

(56) References Cited

U.S. PATENT DOCUMENTS 3,936,325 A * 2/1976 Shanklin ............ 148/26
5,964,963 A 10/1999 Turchan et al.
6,214,636 B1 4/2001 Sawayama et al.
6,489,178 B2 * 12/2002 Coyle et al. ............ 438/51
6,682,872 B2 * 1/2004 Sachdev et al. ........ 430/311

FOREIGN PATENT DOCUMENTS

| DE | 40 18 715 A1 | 12/1991 |
| DE | 195 31 158 A1 | 2/1997 |
| DE | 195 32 250 A1 | 3/1997 |
| DE | 195 32 251 A1 | 3/1997 |
| DE | 199 30 190 A1 | 3/2001 |
| DE | 100 56 732 A1 | 5/2002 |
| EP | 0 476 734 B1 | 3/1992 |
| EP | 0 612 577 B1 | 8/1994 |
| GB | 2 299 287 A | 10/1996 |
| JP | 58-184749 A | 10/1983 |
| WO | WO 96/06700 A2 | 3/1996 |
| WO | WO 96/13914 | * 6/1996 |
| WO | WO 96/19134 | * 6/1996 |
| WO | WO 96/19314 A1 | 6/1996 |

* cited by examiner

*Primary Examiner*—Alexander Ghyka
(74) *Attorney, Agent, or Firm*—Edell, Shapiro & Finnan, LLC

(57) ABSTRACT

A diffusion solder position between two parts has intermetallic phases formed by two solder components. Nanoparticles of a filler material are three-dimensionally distributed in its diffusion region in addition to the intermetallic phases. Furthermore, a process for producing the diffusion solder position and for producing an electronic power component, which has a plurality of diffusion solder positions, is provided.

15 Claims, 5 Drawing Sheets

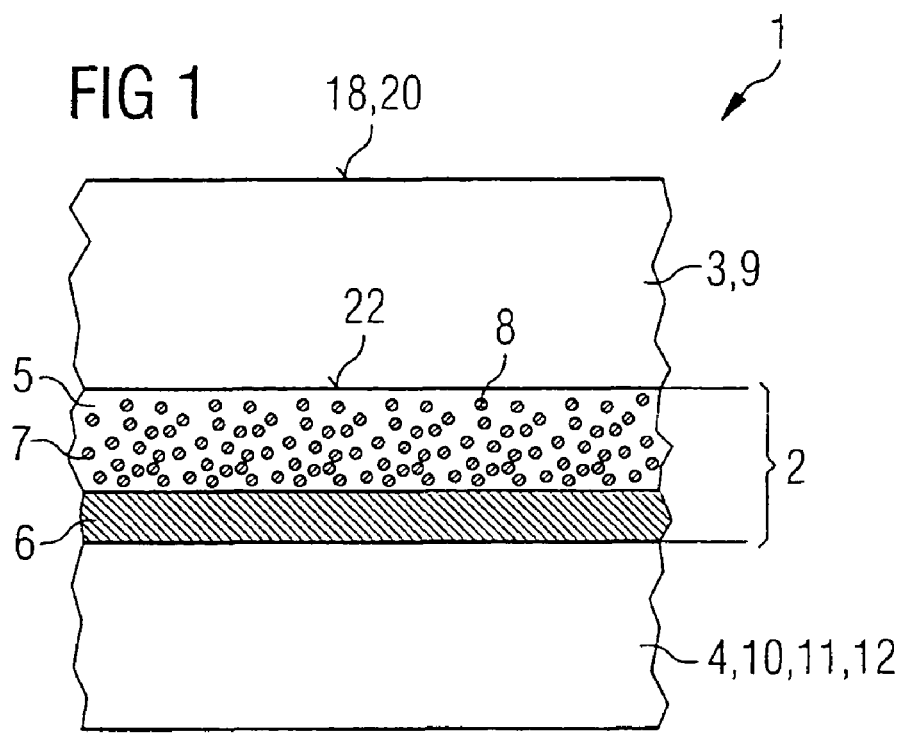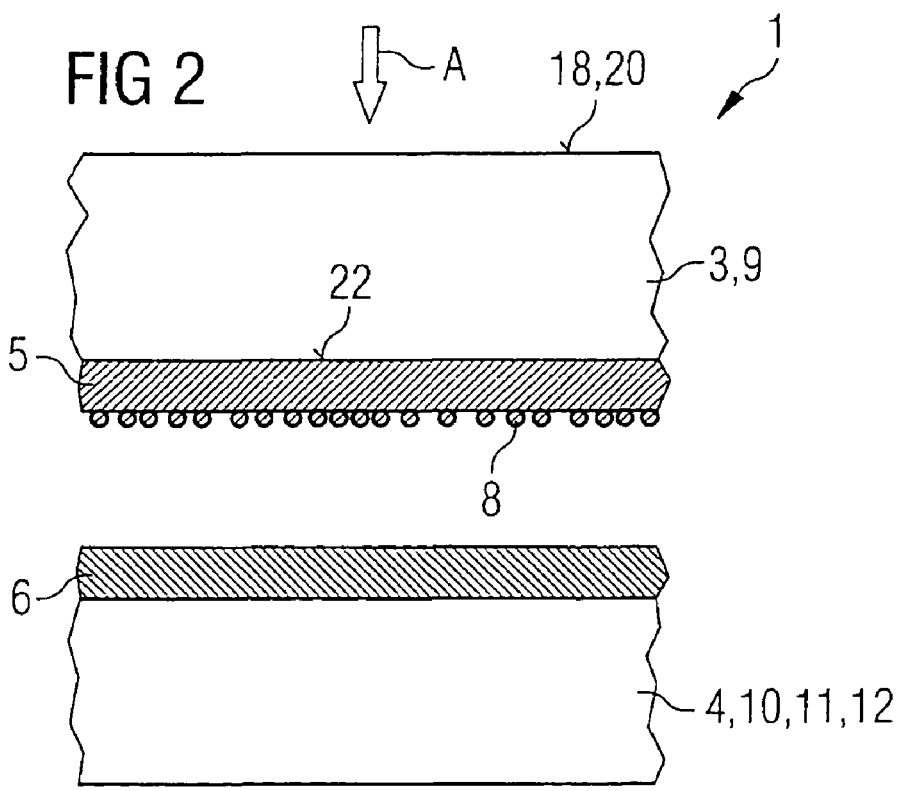

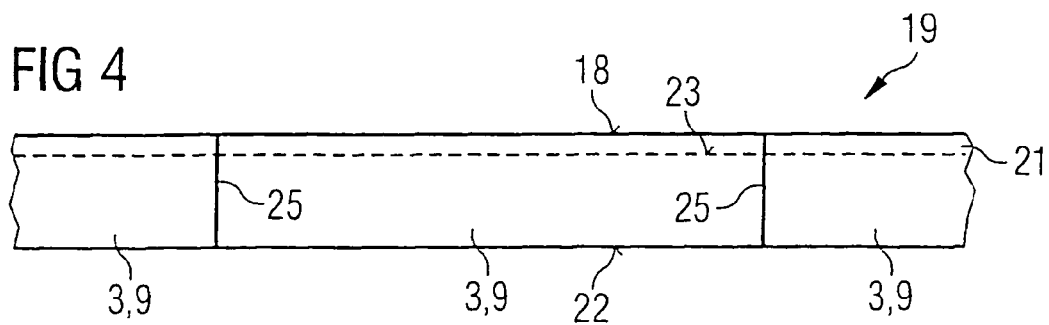
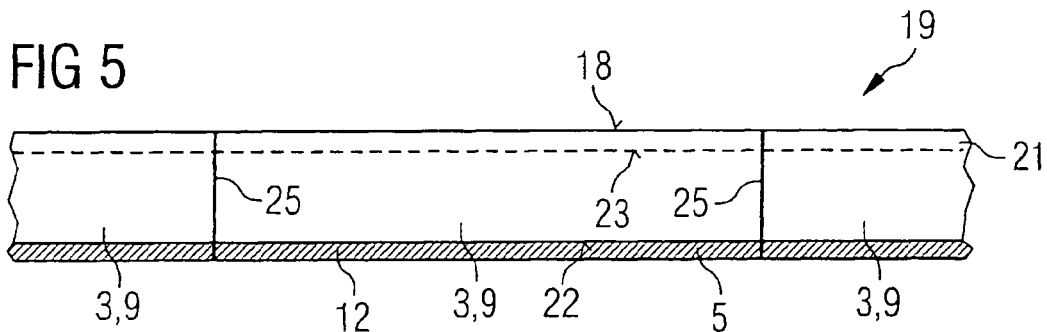
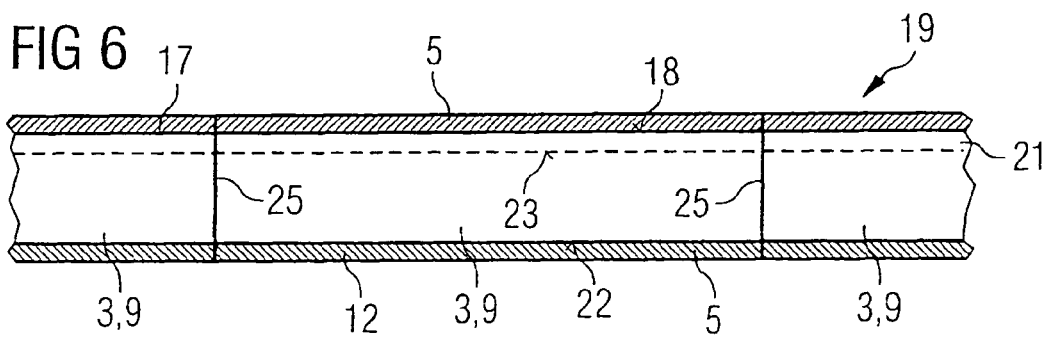
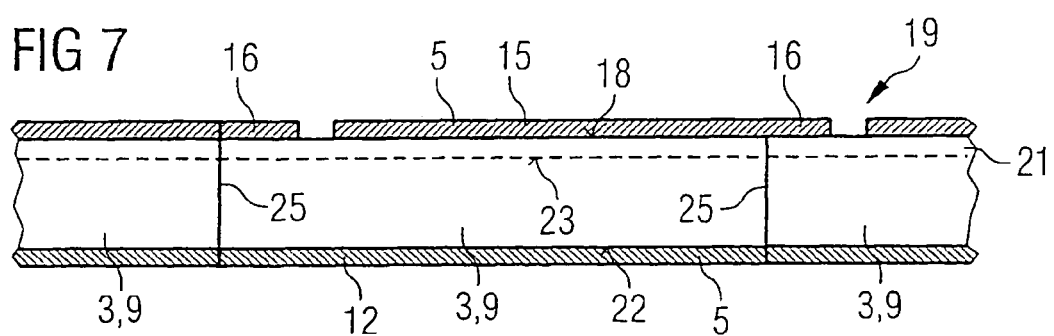

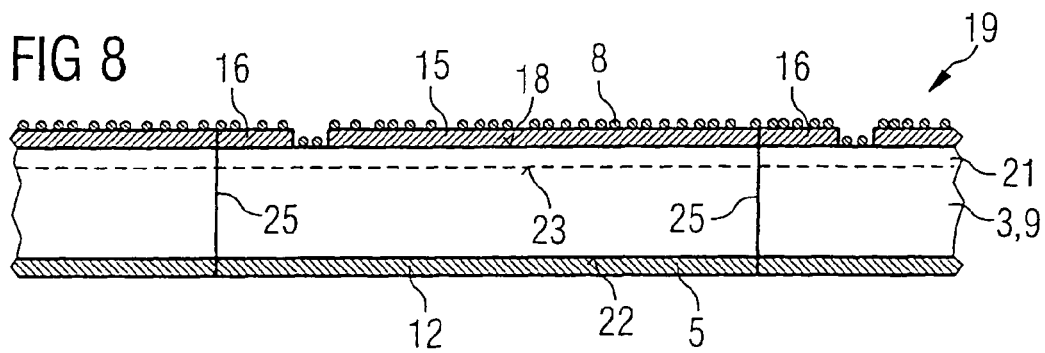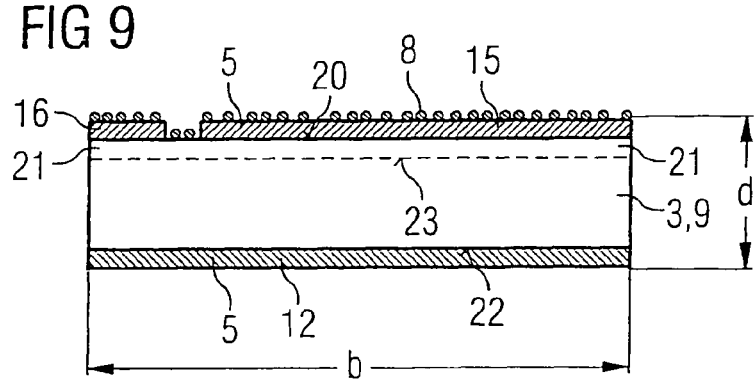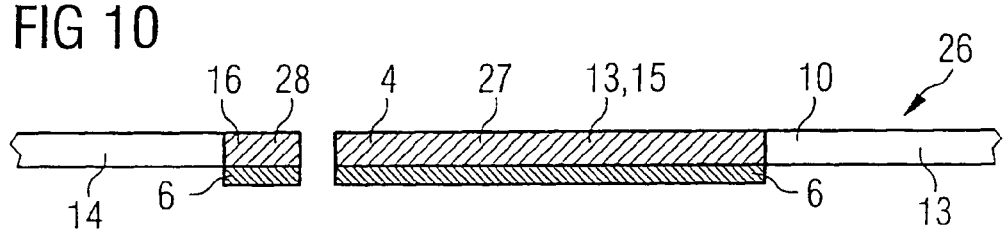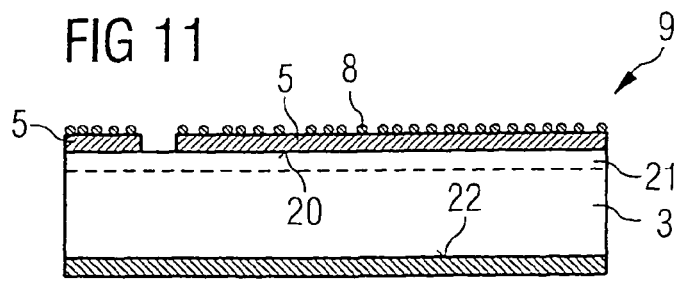

DIFFUSION SOLDER POSITION, AND PROCESS FOR PRODUCING IT

CROSS REFERENCE TO RELATED APPLICATIONS

This application is a continuation of PCT/DE03/00603, filed Feb. 26, 2003, and titled "Diffusion Solder Position, and Process for Producing It," which claims priority under 35 U.S.C. § 119 to German Application No. DE 102 08 635.4, filed on Feb. 28, 2002, and titled "Diffusion Solder Position, and Process for Producing It," the entire contents of which are hereby incorporated by reference.

FIELD OF THE INVENTION

The invention relates to a diffusion solder position between two parts, which are connected via the diffusion solder position, and to a process for producing the diffusion solder position.

BACKGROUND

During diffusion soldering, brittle intermetallic phases are formed. Although these phases ensure a diffusion solder position, which is able to withstand high temperatures, these phases cause problems when connecting parts with different coefficients of thermal expansion such that microcracks migrate through the diffusion solder position. In the extreme, the parts to be connected may even become delaminated. Therefore, higher thermal stability of diffusion solder position connections between two parts is partially offset by an increased sensitivity to mechanical stress and, in particular, to fluctuating thermal loads. This manifests itself when control and power modules for automotive engineering are manufactured using diffusion solder positions.

SUMMARY

Diffusion solder position, can prevent the formation of microcracks under thermomechanical loading and can thus bemore reliable and to have a longer service life.

A diffusion solder position between two parts, which are connected via the diffusion solder position, can have intermetallic phases formed by at least two solder components. The first of the two solder components has a melting point, which is lower than the melting point of the intermetallic phases, and the second of the solder components has a melting point, which is higher than the melting point of the intermetallic phases. In addition, in its diffusion region, the diffusion solder position includes, in addition to the intermetallic phases, nanoparticles of a filler material, which is three-dimensionally distributed.

The presence of nanoparticles in a diffusion region of the diffusion solder location, i.e., in a region in which intermetallic phases have formed, can prevent microcracks, which originate from the intermetallic phases in the event of thermal loading of the diffusion solder position, from migrating through the solder position by the nanoparticles.

This can suppress delamination between the two parts and can ensure that the diffusion solder position has a longer service life and is able to withstand higher stresses. Therefore, the effects of the different coefficients of thermal expansion of the two parts to be connected and the metallic phases are alleviated and in some cases suppressed.

In a diffusion solder position of this type, a region of the diffusion solder position, which lies outside the diffusion region and includes material of the second solder component, can be free of nanoparticles. Since the second solder component has a melting point, which is higher than that of the intermetallic phases, during production of the diffusion solder position, some of the second solder component may not be dissolved or melted. In this region of the diffusion solder position, there is no diffusion and no distribution of nanoparticles, which can disperse themselves in the molten diffusion region of the diffusion solder position during production of the diffusion solder position. This results in solder connections where a microsection through the diffusion solder position reveals a region which is free of nanoparticles.

The diffusion solder position according to the invention provides for thermal stress compensation between the first of the parts and the second of the parts, with the first of the two parts having a lower coefficient of thermal expansion than the second of the two parts. This stress compensation is partially effected by the nanoparticles, which partially absorb a negative effect of the intermetallic phase, namely, the embrittlement of the diffusion solder position. The thermal stress compensation is also partially based on the use of nanoparticles whose coefficient of thermal expansion is between the coefficient of thermal expansion of the first solder component and the coefficient of thermal expansion of the second solder component. This means that the coefficient of thermal expansion of the nanoparticles of the filler material is higher than the coefficient of thermal expansion of the first part and lower than the coefficient of thermal expansion of the second part.

A diffusion solder position of this type may, as a first part, have a semiconductor chip and, as a second part, a metallic leadframe with a semiconductor chip island as source contact for the semiconductor chip and with flat conductors which surround the chip island and serve as drain contact and/or gate contact for the semiconductor chip. In particular, in the case of these semiconductor chips, which require intensive cooling as power components due to high heat losses, a large-area metallic contact via a diffusion solder position both on the active top surface of the semiconductor chip with its common drain contact for several hundred thousand MOS transistors connected in parallel, and a large-area contact-connection via a diffusion solder position to the metallic semiconductor chip island of a leadframe are provided. Both the large-area drain contact and the large-area source contact to the semiconductor chip island can dissipate the heat loss from a power component of this type.

A first solder component having a melting point, which is lower than that of the intermetallic phases of the diffusion solder position, may include tin or a tin alloy. This tin tends to form intermetallic phases with various precious metals, such as gold, silver or copper, resulting in a diffusion solder position, which is able to withstand high temperatures. The second solder component may therefore include silver, gold, copper, or alloys thereof. The materials of the solder components are applied in the form of coatings to the two parts to be connected. Nanoparticles of the diffusion solder position are arranged on these coatings. Therefore, at least one of the solder components has a coating including nanoparticles of the diffusion solder position.

The nanoparticles of the filler material may be arranged on coatings on the top surface of a semiconductor wafer. By arranging the nanoparticles on a semiconductor wafer, the nanoparticles, which have been applied to the top surface, can penetrate into the coating as early as during a heat treatment step carried out for the metallic interconnects and for the contact surfaces of a semiconductor wafer surface.

Furthermore, by applying the nanoparticles to a semiconductor wafer, the nanoparticles can be applied for a large number of semiconductor chips simultaneously and using a single process step.

As an alternative to the semiconductor chip, the chip islands belonging to the leadframe may also have a coating including nanoparticles of the diffusion solder position. These nanoparticles are arranged in layer form, for example, on the chip island, as early as during production of a leadframe, and can then be distributed within the diffusion region of the diffusion solder position when a corresponding coating on the back surface of the semiconductor chip is brought into contact with the chip island.

The nanoparticles of the filler material itself may include an amorphous substance. The coefficient of thermal expansion of amorphous substances can be matched to the parts to be connected such as, for example, a semiconductor chip and a metallic leadframe depending on the composition of the amorphous substances.

The nanoparticles of the filler material may include silicates. Silicates of this type are based on silicon dioxide in amorphous form and have a coefficient of thermal expansion, which is slightly greater than the coefficient of thermal expansion of pure silicon as used for semiconductor chips.

The nanoparticles of the filler material may include borosilicates or phosphosilicates, which have a slightly higher coefficient of thermal expansion than pure silicon dioxide as silicate or as amorphous glass, so that by using suitable mixtures it is possible to achieve an optimally tailored coefficient of thermal expansion for the nanoparticles of the filler material.

The diffusion solder position can be used for electrical connections of components of a power module. As has already been mentioned above, considerable power losses are to be dissipated from power components and power modules. The diffusion solder position produces intensive thermal coupling of the semiconductors of the power module which produce the heat loss to the corresponding circuit carrier of a power module, in particular, if the circuit carrier is made from a metal. Therefore, due to the good thermal conduction properties of metal, the power loss of the power semiconductor can be optimally dissipated via the diffusion solder position. The operating temperatures for corresponding power modules can be increased to over 175° C. up to 230° C.

A process for producing a diffusion solder position between two parts, which are connected via the diffusion solder position, can include the following process steps. First, a first one of the two parts to be connected is coated with a first solder component. Then, a second one of the two parts is coated with a second solder component. The second solder component has a higher melting point than the first solder component. Next, nanoparticles are applied to one of the two coatings. Then, the two parts with their respective coatings are joined together. The second part with the coating of the second solder component is heated to a temperature, which is higher than the melting point of the first solder component and lower than the melting point of the second solder component, to form intermetallic phases.

One part bears the solder component with the low melting point and the other part includes the solder component with the high melting point. However, both parts can initially have coatings including the solder component with a high melting point and for at least one of the two parts to have a thin film of the solder component having the low melting point. Due to the abovementioned temperature conditions, when the two parts are joined together, the first solder component melts at its low temperature, and the nanoparticles can distribute themselves within this molten material. At the same time, atoms of the coating including the high-melting component diffuse into the diffusion region, and form intermetallic phases given a suitable composition. Therefore, during this partial melting in the diffusion region of the diffusion solder position, nanoparticles, which have not melted, and intermetallic phases, which form, are found adjacent to one another.

When the diffusion region of the diffusion solder position is cooling, the nanoparticles impede the progression or migration of microcracks, which can originate from the intermetallic phases. Even if the diffusion solder position is exposed to thermal stresses, due to the different coefficients of thermal expansion of the parts, which are connected to one another, microcracks, which form in the vicinity of the brittle intermetallic phase, cannot propagate through the entire diffusion layer, thereby possibly causing delamination, since the nanoparticles of the filler material prevent it from doing so.

Application of nanoparticles to one of the two coatings can be effected by admixing nanoparticles in an electrolyte bath for the electrodeposition of the coatings. When producing the coatings this way, the nanoparticles are distributed relatively uniformly in the coating as early as during the formation of the coating.

In another example, application of nanoparticles to one of the two coatings can be effected by dusting with subsequent rolling, in order for the nanoparticles to be mechanically anchored to the surface of the coating. This process can be carried out at relatively low cost and leads to an inexpensive result in which the surface of the coating is then covered by nanoparticles.

Application of nanoparticles to one of the two coatings can also be effected by first dusting on the nanoparticles and then melting the nanoparticles into the surface of the coating during a heat treatment step, which may be required for the coating. This technique can be used if, for example, a semiconductor wafer having a plurality of semiconductor chips is to be coated with nanoparticles in the regions of a diffusion solder position on its active top surface. Therefore, this process variant can immediately provide a large number of semiconductor chips with corresponding nanoparticles for the diffusion solder position connections.

To summarize, connections produced by diffusion soldering are brittle and, due to differing expansion coefficients with respect to connection partners or connection parts, such connections are not reliably protected from thermomechanical stress. This thermomechanical stress leads to high stresses at the interfaces. As a result, microcracks may occur in connection materials, in particular, in the vicinity of intermetallic phases, following correspondingly high stresses or during production of the diffusion solder position connections. Stresses of this type, in particular in the event of high temperature fluctuations, may even lead to delamination of the diffusion solder position.

Corresponding mixing of the diffusion materials and solder components with the nanoparticles during the soldering process results in these materials making the expansion coefficients more equal due to their three-dimensional arrangement. This minimizes the thermomechanical stress. Furthermore, migration and propagation of microcracks is suppressed by the nanoparticles.

Therefore, the use of nanoparticles in the diffusion soldering process levels out the expansion coefficients between the diffusion solder including the two solder components and the connection partners or parts.

The nanoparticles can be introduced into the diffusion soldering materials and the diffusion zone, which forms there using various processors. If the alloying systems are already on the parts to be connected, e.g., on a wafer or a leadframe, the nanoparticles can be applied to the surface of the alloying systems. Then, the parts to be connected are joined together. During this joining operation, the nanoparticles are directly at the interface between the two solder components. If the alloying system used is a preform, the nanoparticles can be mixed into the melt during production of the preform, for example, during the production of strips, wires, beads, etc., and then rolled into the alloy following solidification. The nanoparticles can also be introduced during electrodeposition of the alloy coating on the respective parts to be connected by being admixed to the deposition electrolyte. The nanoparticles are homogeneously incorporated into the alloy layer during the deposition of the alloy coating. Therefore, when the joining partners are being connected, the nanoparticles are initially homogeneously distributed in the melt, but may then additionally accumulate at the interface as a result of suitable convective flows in the melt, so that the nanoparticles are in an increased concentration in the region of the intermetallic phases in what is known as the diffusion region of the diffusion solder position.

BRIEF DESCRIPTION OF THE FIGURES

The invention will now be explained in more detail on the basis of embodiments and with reference to the appended figures, in which:

FIG. 1 shows a diagrammatic oblique microsection through a diffusion position of a first embodiment of the invention.

FIG. 2 shows a diagrammatic oblique microsection through parts which are joined together via a diffusion solder position.

FIGS. 4 to 8 show diagrammatic cross sections through a semiconductor wafer for fabrication of a plurality of electronic components which include diffusion solder positions. FIG. 4 shows a diagrammatic cross section through a semiconductor wafer. FIG. 5 shows a diagrammatic cross section through a semiconductor wafer after application of a first solder component to its back surface. FIG. 6 shows a diagrammatic cross section through a semiconductor wafer after application of a first solder component to its active top surface. FIG. 7 shows a diagrammatic cross section through a semiconductor wafer after patterning of the first solder component on its active top surface. FIG. 8 shows a diagrammatic cross section through a semiconductor wafer after application of nanoparticles to its patterned first solder component.

FIG. 9 shows a diagrammatic cross section through a semiconductor chip for a semiconductor component with diffusion solder positions.

FIGS. 10 to 12 show diagrammatic cross sections through parts which are connected to one another to form a component with diffusion solder positions. FIG. 10 shows a diagrammatic cross section through a flat conductor frame with flat conductor ends which are coated with a second solder component. FIG. 11 shows a diagrammatic cross section through a semiconductor chip with coatings of a first solder component 5 on the top and back surfaces. FIG. 12 shows a diagrammatic cross section through a chip island of a leadframe having a coating of a second solder component.

DETAILED DESCRIPTION

Figure 3:
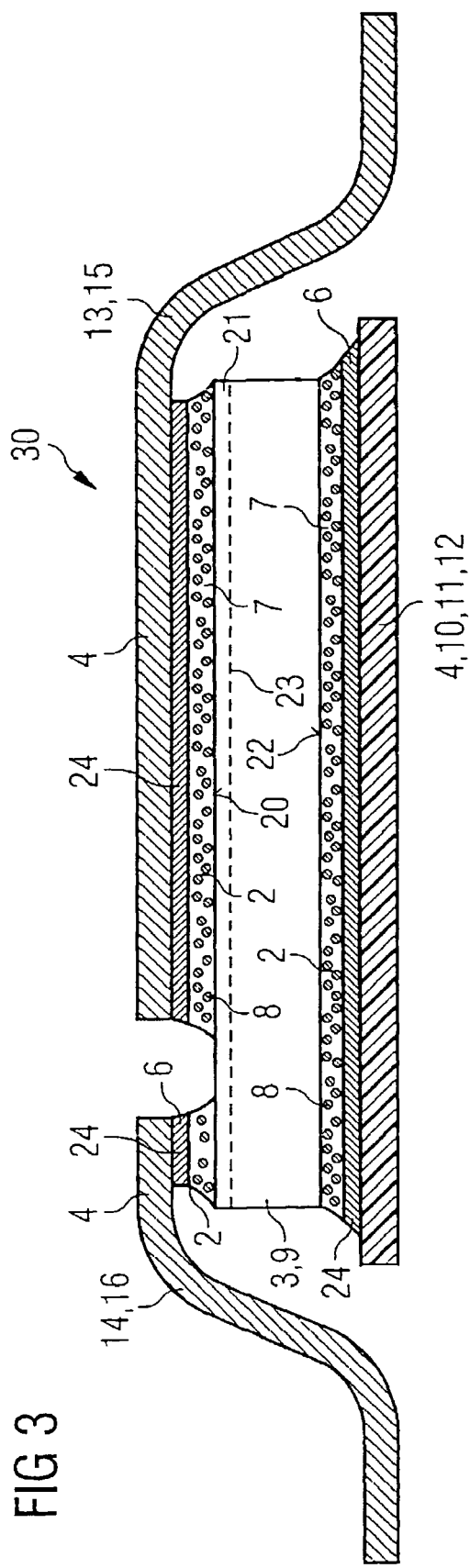
FIG. 3 shows a diagrammatic cross section through an electronic component which includes a plurality of diffusion solder positions.

FIG. 1 shows a diagrammatic oblique microsection through a diffusion solder position 2 of a first embodiment of the invention. Reference numeral 3 denotes a first part, which is electrically and mechanically connected to a second part 4 via the diffusion solder position 2. Reference numeral 5 denotes a first solder component. The melting point of the first solder component is lower than the melting point of the second solder component 6. The second solder component 6 has a melting point which is higher than the melting point of the intermetallic phases, which form from the two solder components 5 and 6. The melting point of the second solder component 6 is also higher than the soldering temperature at which the two parts 3 and 4 are joined together with the aid of the diffusion solder position 2.

Of the material of the second solder component 6 with a high melting point, a proportion, which corresponds to the saturation limit for the second solder component 6 in the melt of the first solder component 5, diffuses into the diffusion region 7 of the diffusion solder position 2. Therefore, a diffusion solder position 2 includes an undissolved residual region of the second solder component 6 in the oblique microsection. Nanoparticles 8 are initially distributed homogeneously in the molten region of the first solder component 5, and as the formation of intermetallic phases increases in the diffusion solder position 2, may become distributed inhomogeneously, as shown in FIG. 1, i.e., a higher concentration of nanoparticles 8 may occur in the region of the intermetallic phases. This inhomogeneity may be partially caused by convection phenomena in the molten first solder component 5.

Accumulation of the nanoparticles 8 in the vicinity of the phase transition from the first solder component 5 to the undissolved part of the second solder component 6 is a feature of this particular type of diffusion solder position 2.

In this first embodiment of the invention, the first part 3 is a semiconductor chip 9 with a lower coefficient of thermal expansion than the second part 4, which forms part of a metallic leadframe 10. This leadframe 10 is connected to the back surface 22 of the semiconductor chip over a large area via the diffusion solder position 2. The nanoparticles 8 prevent the formation and propagation of microcracks within the diffusion solder position 2 at the brittle intermetallic phases formed during the diffusion soldering. Since the second part 4 includes a leadframe 10, which includes a copper alloy and therefore has a significantly higher coefficient of thermal expansion than the first part 3. The leadframe includes a semiconductor chip. The expansion coefficient of the nanoparticles is set within a range between the values for the expansion coefficients of the first part 3 and the second part 4. The coefficient of thermal expansion of the nanoparticles can be matched to the coefficients of thermal expansion of the first part 3 and the second part 4 by use of suitable amorphous silicates. Amorphous silicates of this type may be borosilicates or phosphosilicates. Part of the high-melting second solder component 6 outside the diffusion region 7 remains free of nanoparticles, since the second solder component 6 is not completely consumed during the melting and diffusing into the melt of the first solder component 5.

A diffusion solder position 2 of this type provides thermal stress compensation between the first of the two parts and the second of the two parts 3 and 4. In this first embodiment of the invention, as mentioned above, the diffusion solder position 2 may, as the first part 3, include a semiconductor chip and, as the second part 4, may include a metallic leadframe having a semiconductor chip island 11 which serves as source contact 12 for a power component. Therefore, the entire source current of a power component of this type can be fed to the semiconductor material 9 via the chip island 11.

FIG. 2 shows a diagrammatic oblique microsection through parts 3, 4, which are to be connected to one another via a diffusion solder position 2. Components which have the same functions as in FIG. 1 are denoted by identical reference numerals and are not explained once again.

For this purpose, the first part 3, namely, a semiconductor chip 9, is coated on its back surface 22 with a low-melting first solder component 5, to which nanoparticles 8 have been applied. This application can be effected by rolling or stamping in the nanoparticles 8 on the top surface of the first solder component 5, which melts at a low temperature. Another option is for the first solder component 5 to be electrodeposited on the back surface of the semiconductor chip in an electrolyte bath, which at the same time contains nanoparticles 8. In this case, the nanoparticles 8 are incorporated in a uniform and homogeneous distribution in the solder component 5.

The lower part of FIG. 2 shows an outline of an oblique microsection through a second part 4, which bears a second solder component 6 on its top surface. This solder component 6 is a high-melting solder component 6, and therefore, has a higher melting point than the low-melting solder component 5 on the first part 3. This high-melting solder component may also include a multilayer arrangement that includes gold, silver, nickel, and/or alloys thereof. The top layer is involved in the diffusion soldering and forming intermetallic phases with the low-melting solder component 5.

When the two parts 3, 4 are moved together in the direction indicated by arrow A at a temperature at which at least the low-melting solder component 5 is molten and the nanoparticles 8 are distributed uniformly in the melt, the high-melting component 6 will partially diffuse into the low-melting component 5 and will form intermetallic phases in the diffusion region. During cooling of the diffusion solder position 2, an inhomogeneous distribution of the nanoparticles 8 may be established within the diffusion region. In the diffusion region of a diffusion solder position, these nanoparticles 8 prevent propagation of microcracks caused by intermetallic phases. For this purpose, the low-melting solder component 5 may include tin or a tin alloy, while the second, high-melting solder component 6 includes silver, gold, copper, or alloys thereof.

FIG. 3 shows a diagrammatic cross section through an electronic component 30 for a power module which includes a plurality of diffusion solder positions 2. Components which have the same functions as in the previous figures are denoted by the same reference numerals and are not explained once again.

Reference numeral 10 denotes a leadframe, reference numeral 11 denotes a semiconductor chip island of the leadframe, and reference numeral 12 denotes a source contact of the electronic power component 30. Reference numeral 13 denotes a large-area flat conductor which contact-connects the parallel-connected drain contacts on the top surface of the power component 30. Reference numeral 14 denotes a flat conductor which produces a gate contact 16 for the top surface of the semiconductor chip.

The electronic power component 30 includes several hundred thousand MOS transistors 21 connected in parallel, which are arranged in the region of the active top surface 20 of the semiconductor chip. The active region of the top surface 20 is marked by a dashed line 23. Whereas the common source region can be contact-connected over a large area by the back surface 22 of the semiconductor chip 9 by the chip islands 11 being electrically and mechanically connected to the back surface 22 of the semiconductor chip 9 with the aid of a diffusion solder position 2, the several hundred thousand gate electrodes are combined to form a gate contact 16 which can be connected to a higher-level circuit via the flat conductor 14.

The flat conductor 14 for the gate contact 16 is connected to the parallel-connected gate electrodes of the electronic power component 30 via a diffusion solder position 2. A third diffusion solder position 2 includes the electrical and mechanical connection of the flat conductor 13 to the drain connection comprising several hundred thousand electrodes connected in parallel. To connect the flat conductors 13 and 14, which includes a metal, and the chip islands 11 of the leadframe 10, which include a metal plate, to the individual components of the semiconductor chip 9 with the aid of diffusion solder positions 2, the first, low-melting solder component 5 is applied to the electrodes of the semiconductor web 9, so that the semiconductor 9 forms the first part 3 of the diffusion solder position. The metallic parts, which are to be connected to the semiconductor include flat conductors 13 and 15 and chip island 11, are first surface-treated in order to prevent premature diffusion of the flat conductor metal or of the metal of the semiconductor chip island 11 to the diffusion solder position.

Whereas the metal of the flat conductors 13 and 14 and of the chip island 11 is substantially a copper alloy, the diffusion position coating may be a nickel alloy. The second high-melting solder component 6 may be formed by a gold or silver alloy. The overall structure can be made ready for a diffusion furnace, and the diffusion soldering can be carried out in the diffusion furnace. For this purpose, in this embodiment of the invention, the low-melting solder component 5, which has been applied to the surfaces of the semiconductor chip, is mixed with nanoparticles of silicates. If the second solder component 6 is completely consumed in the diffusion region during the diffusion soldering, at least one diffusion-inhibiting layer 24 remains between the diffusion region 7 and the metallic components, such as flat conductors 13, 14 and chip island 11.

FIGS. 4 to 8 show diagrammatic cross sections through a semiconductor wafer 19 for fabricating a plurality of electronic power components 30, which have diffusion solder positions. Components which have the same functions in the following FIGS. 4 to 8 as in the previous figures are denoted by the same reference numerals and are not explained once again.

FIG. 4 shows a diagrammatic cross section through a semiconductor wafer 19. On its active top surface 18, in a region, which is delimited by a dashed line 23, this semiconductor wafer has MOS transistors, which are connected in parallel by their several hundred thousand gate connections and are connected in parallel by their several hundred thousand drain electrodes on the top surface 18 of the semiconductor wafer 19. The back surface 22 is used as a source region for a plurality of electronic power components.

FIG. 5 shows a diagrammatic cross section through a semiconductor wafer 19 following application of a first solder component 5 to its back surface 22. This solder component 5 on the back surface 22 is a metallic covering of the back surface with a first solder component 5, which has a lower melting point than a second solder component 6, which can form intermetallic phases with the first solder component 5 during diffusion soldering. This first solder component 5 may be tin or a tin alloy. By dipping the semiconductor wafer 19 into a suitable tin bath, it can be applied to both the back surface 22 of the semiconductor wafer 19 and the active top surface 18 of the semiconductor wafer 19, or in two separate steps, it can be applied first to the back surface 22, as shown in FIG. 5, and then to the active top surface 18, as shown in FIG. 6.

FIG. 6 shows a diagrammatic cross section through a semiconductor wafer 19 following application of a first solder component 5 to its active top surface 18. This top surface 18 is also covered with a level metal surface including the low-melting solder component 5 and is patterned in a subsequent step.

FIG. 7 shows a diagrammatic cross section through a semiconductor wafer 19 after patterning of the first solder component 5 on the active top surface 18 of the semiconductor wafer 19. The patterning of the solder component 5 on the active top surface 18 of the semiconductor wafer 19 is necessary in order to prepare a common, parallel-connecting gate connection 16 for each semiconductor chip of the semiconductor wafer 19 and in order to create a large-area contact for the parallel-connected drain electrodes using a drain contact 15. After this step, the entire semiconductor wafer 19 can be dusted with nanoparticles 8 including a silicate, which are then stamped into the coating formed by the first solder component 5 under pressure.

Alternatively, the solder component 5 may be printed onto the active top surface of the semiconductor wafer 19 in patterned form by a solder paste which contains the nanoparticles 8. A level metal surface formed from the first solder component 5 may also be electrodeposited on the active top surface of the semiconductor chip 19. Nanoparticles 8 are distributed in the electrolyte bath so that the nanoparticles 8 are incorporated in homogeneously distributed form in the solder component 5 on the active top surface of the semiconductor wafer. Since the nanoparticles 8 are non-conductive silicates, for example, borosilicate or phosphosilicate, the entire active surface 18 can be provided with a layer of nanoparticles without short-circuiting the electronic structures on the active top surface 18 of the semiconductor wafer 19.

FIG. 9 shows a diagrammatic cross section through a semiconductor chip 9 for a semiconductor component with diffusion solder positions 2. Components with the same functions as in the previous figures are denoted by identical reference numerals and are not explained once again.

The semiconductor wafer was sawed open along the parting lines indicated in FIGS. 4 to 8, resulting in the cross section through the semiconductor chip illustrated in FIG. 9. These cross sections are only diagrammatic and are not to scale. In reality, the thickness d of a semiconductor chip 9 of this type is between 50 µm and 750 µm, whereas the width b of a semiconductor chip 9 of this type may be several centimeters.

Figure 12:
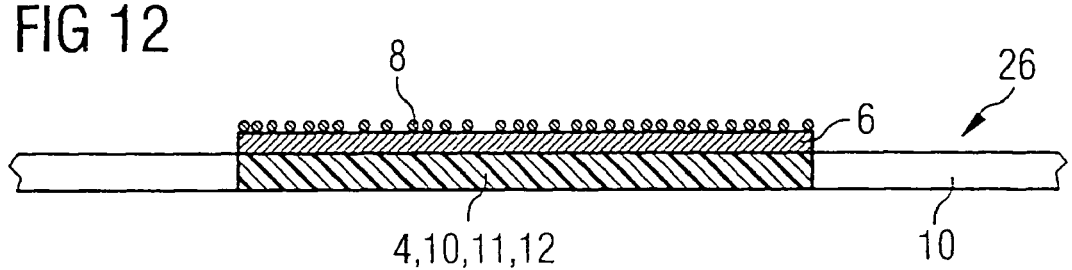

To fabricate an electronic power component from this semiconductor chip 9, FIGS. 10 to 12 show diagrammatic cross sections through parts 3, 4 which have been connected to one another to form a component with diffusion solder positions 2. Components with the same functions as in the previous figures are denoted by the same reference numerals and are not explained once again for FIGS. 10 to 12.

FIG. 10 shows a diagrammatic cross section through a flat conductor frame 26 which bears flat conductors 13 for a common drain contact 15 and flat conductors 14 for a common gate contact 16. The respective end regions 27 and 28 of the flat conductors 13, 14, respectively, which are to be connected to the drain electrodes and to the gate electrodes running parallel, are coated with a second soldering component 6. This soldering component 6 may include a plurality of metal layers, which on the one hand prevent diffusion of the flat conductor material into the diffusion solder position 2 and on the other hand provide a diffusion solder material which can diffuse into the molten solder of the first solder component 5. Since these flat conductors 13, 14 are to be placed onto the active top surface of the semiconductor chip 9, no nanoparticles 8 are incorporated into the second solder component 6, especially since the first solder component on the semiconductor chip 9, as shown in FIG. 11, already includes nanoparticles.

FIG. 11 shows a diagrammatic cross section through a semiconductor chip 9 with coatings of a first solder component on the top surface 18 and on the back surface 22, the cross section shown in FIG. 11 corresponding to the cross section shown in FIG. 9. Consequently, there is no need to interpret or explain FIG. 11.

FIG. 12 shows a further part of the flat conductor frame 26, which bears a chip island 11, which for its part is coated with a second solder component 6 and to which a layer of nanoparticles 8 has been applied. This layer of nanoparticles may be incorporated into the solder component 6 as early as during electrodeposition of the solder component 6.

Figure 13:
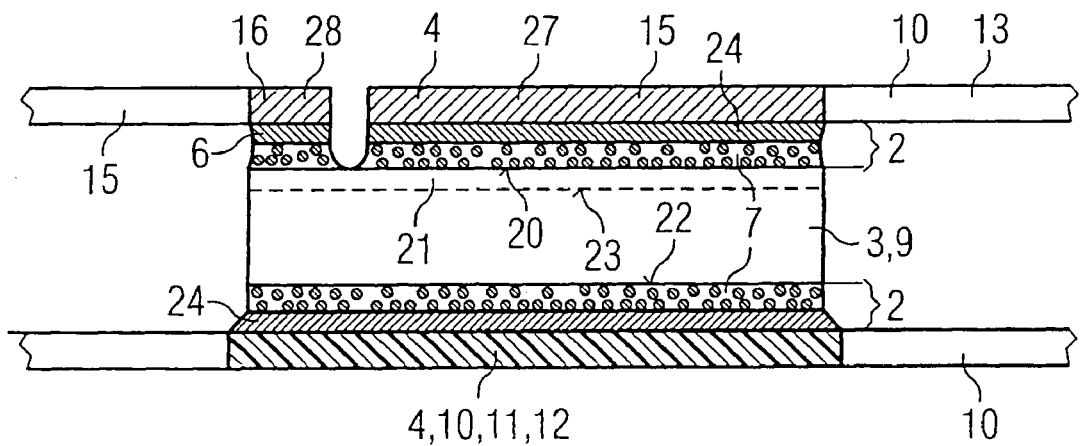
FIG. 13 shows a diagrammatic cross section through an electronic component with diffusion solder positions before the flat conductors are bent over to form external connections.

FIG. 13 shows a diagrammatic cross section through an electronic component with diffusion solder positions 2 before the flat conductors 13, 14 are bent over to form external connections. Both the chip island 11 and the flat conductors 13, 14 are connected to one another on a common flat conductor frame, the flat conductor frame having two levels, namely a level for the back surface 22 of the semiconductor chip 9 with a semiconductor chip island 11 and a further level for the active top surface 18 of the semiconductor chip 9 with the corresponding flat conductors 13, 14.

After these components have been brought together, as shown in FIG. 13, and diffusion soldering has been carried out, the result is the outline cross section shown in FIG. 13, i.e., the nanoparticles 8 are substantially distributed within the solder component 5, whereas a remainder of the solder component 6 has been retained in unchanged form, or at least there remains a layer of a diffusion-inhibiting metal alloy to prevent the material of the leadframe from being able to diffuse into the diffusion solder position 2 during the diffusion soldering.

After the basic component shown in FIG. 13 has been completed with a diffusion-soldered common gate contact 16, a common drain contact 15, and common source contact 12, to complete the electronic power component the flat conductors 13, 14 can be bent over to the level of the chip island. The entire component can be packaged in a plastic housing (not shown). The end result is in this case an electronic power component 30 as shown in FIG. 3.

The above description of the exemplary embodiments in line with the present invention serves merely for illustrative purposes and not to limit the invention. The invention allows various changes and modifications without departing from the scope of the invention and its equivalents.

We claim:

1. A diffusion solder position between two parts, the two parts being connected via the diffusion solder position, the diffusion solder position comprising:
    intermetallic phases formed by at least two solder components, the first of the solder components having a first melting point, the first melting point being less than the melting point of the intermetallic phases, the second of the solder components having a second melting point, the second melting point being higher than the melting point of the intermetallic phases; and
    a diffusion region, the diffusion region having three-dimensionally distributed nanoparticles of a filler material.

2. The diffusion solder position as claimed in claim 1, wherein the nanoparticles are arranged in a three-dimensionally inhomogeneous distribution in the diffusion region of the diffusion solder position.

3. The diffusion solder position as claimed in claim 1, wherein a region of the diffusion solder position, which lies outside the diffusion region, is free of nanoparticles, the region comprising material of the second solder component.

4. The diffusion solder position as claimed in claim 1, wherein the diffusion solder position provides thermal stress compensation between the first of the two parts and the second of the two parts, the first of the two parts having a lower coefficient of thermal expansion than the second of the two parts.

5. The diffusion solder position as claimed in claim 1, wherein the nanoparticles of the filler material have a coefficient of thermal expansion which is higher than the coefficient of thermal expansion of the first part and lower than the coefficient of thermal expansion of the second part.

6. The diffusion solder position as claimed in claim 1, wherein the first part is a semiconductor chip and the second part is a metallic leadframe with a semiconductor chip island as source contact for the semiconductor chip and with flat conductors as drain and gate contact for the semiconductor chip.

7. The diffusion solder position as claimed in claim 1, wherein the first solder component includes tin or a tin alloy.

8. The diffusion solder position as claimed in claim 1, wherein the second solder component includes one of silver, gold, copper, or alloys thereof.

9. The diffusion solder position as claimed in claim 1, wherein the solder components have a coating, the coating including nanoparticles of the diffusion solder position.

10. The diffusion solder position as claimed in claim 1, wherein the nanoparticles of the filler material are arranged on coatings of an active top surface of a semiconductor wafer.

11. The diffusion solder position as claimed in claim 1, wherein a chip island of a leadframe has a coating, the coating including nanoparticles of the diffusion solder position.

12. The diffusion solder position as claimed in claim 1, the diffusion solder position further comprising:
    a large-area, common drain contact for a plurality of transistors connected in parallel, the common drain contact being arranged on the active top surface of a semiconductor chip, the common drain contact having a coating, the coating including nanoparticles of the diffusion solder position.

13. The diffusion solder position as claimed in claim 1, wherein the nanoparticles of the filler material include amorphous substances.

14. The diffusion solder position as claimed in claim 1, wherein the nanoparticles of the filler material include silicates.

15. The diffusion solder position as claimed in claim 1, wherein the nanoparticles of the filler material include borosilicate or phosphosilicate.

* * * * *